United States Patent [19]

Shipp et al.

[11] 4,336,448

[45] Jun. 22, 1982

[54] BINARY COUNTER AND CIRCUIT FOR TESTING SAME

[75] Inventors: Robert A. Shipp; Chuan-Yung Hung, both of Kokomo, Ind.

[73] Assignee: General Motors Corporation, Detroit, Mich.

[21] Appl. No.: 141,344

[22] Filed: Apr. 18, 1980

[51] Int. Cl.³ .................... H03K 21/30; G06M 3/12
[52] U.S. Cl. ........................... 235/92 MS; 235/92 PL
[58] Field of Search ......... 235/92 MS, 92 PE, 92 PB, 235/92 DE, 92 PL; 73/5, 6

[56] References Cited

U.S. PATENT DOCUMENTS

| | | | |
|---|---|---|---|
| 3,976,893 | 8/1976 | Banfi | 307/208 |
| 4,001,553 | 1/1977 | Troutman et al. | 235/92 MS |
| 4,021,645 | 5/1977 | Saufferer | 235/92 MS |
| 4,182,961 | 1/1980 | Dingwall | 307/225 C |
| 4,189,635 | 2/1980 | Sheller | 235/92 MS |
| 4,223,213 | 9/1980 | Bibbee et al. | 235/92 MS |

Primary Examiner—Joseph M. Thesz
Attorney, Agent, or Firm—Albert F. Duke

[57] ABSTRACT

Steering logic interconnects the individual portions of a partitioned counter and are controlled by test logic to selectively apply a clock input to the first stage of each portion of the counter in sequence and to detect overflow of the individual portions so as to determine whether the various stages of each portion are properly connected together, as well as to determine whether the steering logic properly interconnects the various portions of the counter.

3 Claims, 2 Drawing Figures

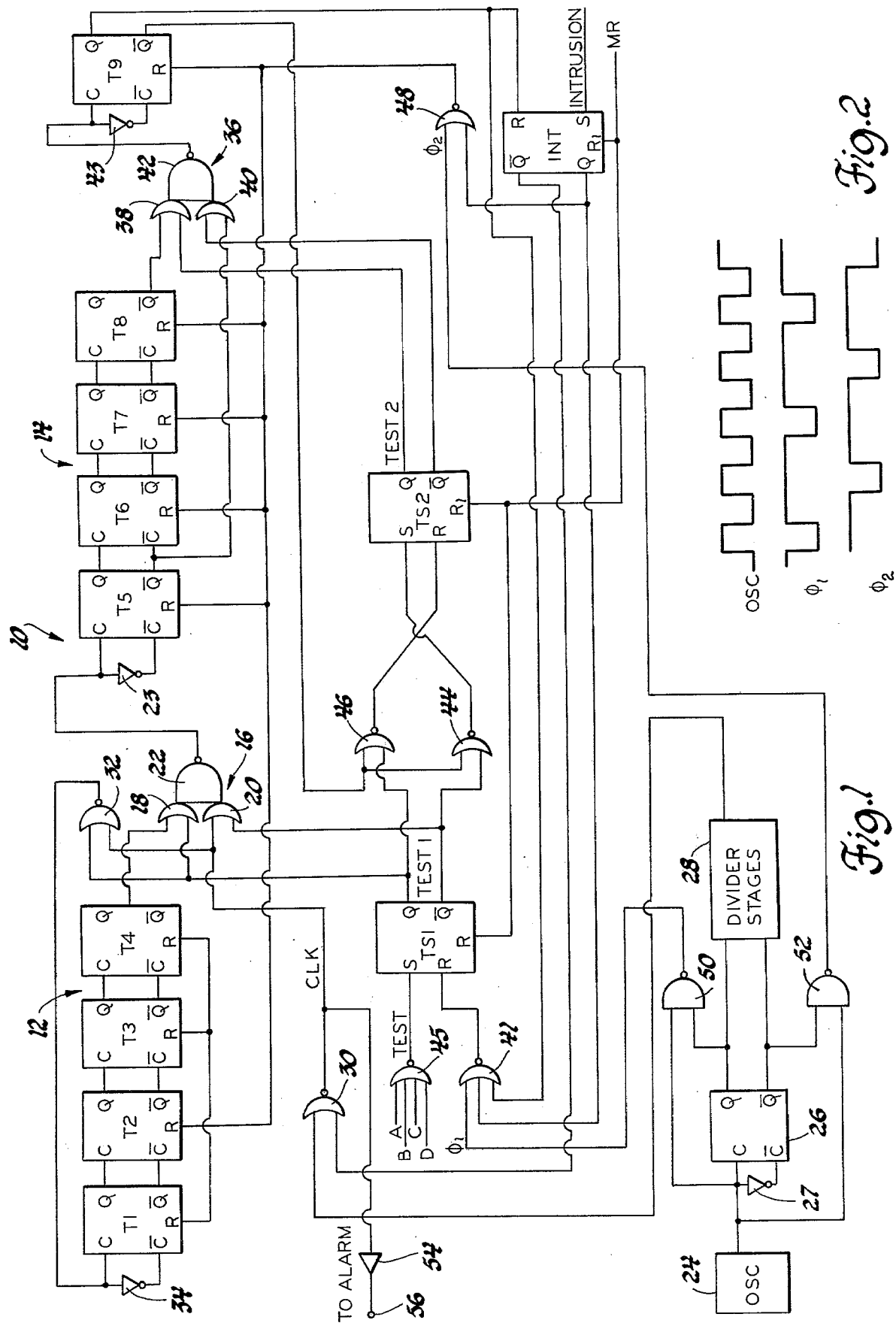

BINARY COUNTER AND CIRCUIT FOR TESTING SAME

FIELD OF THE INVENTION

This invention relates to counters and, more particularly, to a counter which is constructed to permit a relatively fast testing of the integrity of the interconnect between stages thereof.

BACKGROUND OF THE INVENTION

Custom integrated circuits for various applications employ a binary counter to implement a timing function. For example, custom integrated circuits are presently available for detecting unauthorized entry of an automobile. The circuit utilizes a binary counter as a timer for controlling the time of activation of an alarm device following detection of unauthorized entry. Because of cost considerations, the frequency of the time base is relatively high and is divided down on the chip to provide, for example a 1 Hz. input to the counter. With a 1 Hz. input, an 8-bit binary counter provides an approximate 4 minute time interval for activation of the alarm device following intrusion. The timer interval is relatively large in relation to the time required to test the remainder of the circuit and, accordingly, it is desirable to reduce the time interval necessary to test the operability of the counter.

SUMMARY OF THE INVENTION

With the foregoing in mind, it is an object of the present invention to provide a counter which is partitioned into a plurality of portions which are interconnected by logic which permits each of the individual portions to be tested independently in order to verify the integrity of the internal connection of the various stages of the counter.

In accordance with the present invention, steering logic interconnects the individual portions of a partitioned counter and are controlled by test logic to selectively apply a clock input to the first stage of each portion of the counter in sequence and to detect overflow of the individual portions so as to determine whether the various stages of each portion are properly connected together, as well as to determine whether the steering logic properly interconnects the various portions of the counter.

A more complete understanding of the present invention may be had from the following detailed description which should be read in conjunction with the drawings, in which:

BRIEF DESCRIPTION OF THE DRAWINGS

FIG. 1 is a logic diagram of the present invention; and

FIG. 2 is a timing diagram useful in explaining the invention.

DESCRIPTION OF THE PREFERRED EMBODIMENT

Referring now to the drawings and initially to FIG. 1, a counter generally designated 10 is partitioned into two portions generally designated 12 and 14. The counter 10 comprises eight toggle flip-flops T1–T8 which are toggled on the falling edge of a clock signal applied to the C input thereof. The stages T4 and T5 are interconnected by a complex gate generally designated 16, comprising OR gates 18 and 20 and NAND gate 22. The output of gate 22 is applied to the C input of T5 and to the $\overline{C}$ input of T5 through inverter 23. The clock input to the counter 10 is derived from an oscillator 24, which produces a 32 Hz. signal to a plurality of divider stages, the first of which is designated 26 and the remainder of which are designated 28. The first stage 26 has its C and $\overline{C}$ inputs tied together by an inverter 27. The output of the final divider stage produces a 1 Hz. signal which is fed through NOR gates 30 and 32 to the C input of T1 and to the C inputs of T1 through an inverter 34. The output of the counter 10 is one input to a complex gate 36 comprising OR gates 38 and 40 and NAND gate 42. The output of the gate 42 is applied to the C input of an overflow toggle flip-flop T9 and to the $\overline{C}$ input thereof through inverter 43. The gates 16, 30, 32 and 36 are controlled from set/reset flip-flops TS1, TS2 and INT. TS1 is set from the output of a NOR gate 45 designated TEST which responds to inputs A, B, C and D and is reset by a strobe pulse $\phi_1$ through a NOR gate 41 when the Q outputs of T9 and INT are both low. TS2 is set through a NOR gate 44 when TS1 $\overline{Q}$ and T9 $\overline{Q}$ are both low and reset through a NOR gate 46 when TS1 Q and T9 $\overline{Q}$ are both low. The Q outputs of TS1 and TS2 are designated TEST 1 and TEST 2, respectively. T1–T9 are reset by a strobe pulse $\phi_2$ through a NOR gate 48 when INT Q is low. TS1, TS2 and INT are also resettable from a master reset input designated MR. $\phi_1$ and $\phi_2$ are obtained from the outputs of NAND gates 50 and 52, respectively, each of which have an input tied to the output of the oscillator 24, the other input being the $\overline{Q}$ and Q outputs, respectively, of the F/F 26. The relationship of the strobe pulses $\phi_1$ and $\phi_2$ to the oscillator output is depicted in FIG. 2.

As previously indicated, the counter and test logic may comprise a portion of the total logic in a custom integrated circuit performing the function of sounding an alarm for a predetermined interval of time in the event of an unauthorized entry to an automobile. With this particular application in mind, the F/F's TS1, TS2 and INT are assumed to be in a reset state, having been reset by a positive pulse at the master reset input MR. The master reset input occurs when power is first applied to the circuit and also upon actuation of a DISARM input, which appears whenever the vehicle door is unlocked by the door lock key. With INT in a reset state, the gate 48 is enabled so that the counter 10 is reset by the strobe pulses from $\phi_2$. Should an unauthorized intrusion occur, such as for example opening the trunk or hood while the circuit is in an ARMED state, other logic on the chip responds to such conditions and sets the F/F INT, which disables the gate 48 and enables the gate 30. Since TS1 and TS2 are reset, the gates 32, 18 and 38 are enabled and the gates 20 and 40 are disabled. Accordingly, the output of the complex gate 16 connected with T5 follows the Q output of T4 and, accordingly, an 8-stage counter is established which counts the falling edges of the 1 Hz. input to the gate 30. Clock pulses are also applied through an amplifier 54 to an alarm connected with output pin 56. Accordingly, during the time that the counter 10 is being clocked, the alarm is energized. When the counter 10 overflows, i.e., when T8 $\overline{Q}$ goes from low to high, the C input of T9 goes low and its Q output high, resetting INT, disabling the gate 30 and extinguishing the alarm.

In order to rapidly test the integrity of the counter as well as other portions of the inegrated circuit, the inputs designated A, B, C and D are brought to a low state which sets the F/F TS1, placing the circuit in the TEST 1 condition where the Q output of TS1 is high. The inputs A, B, C and D may, for example in normal operation of the alarm system, respond to the positions of the electric door lock and unlock switch, the position of the mechanical door lock actuator and to an ARM condition. Preferably, the inputs A, B, C and D are never placed in a low state concurrently during the normal operation of the circuit so as to prevent the circuit from being placed in the test mode inadvertently.

With TS1 set, the gates 32 and 18 are disabled and the gate 20 is enabled. By simulating an intrusion, i.e., setting the F/F INT, the gate 30 is enabled and the 1 Hz. clock pulses are applied through the gates 20 and 22 to the portion 14 of the counter 10. While the portion 14 is counting the clock pulses, the output terminal 56 will be pulsed to indicate that the oscillator 24 and dividers 26, 28 are operating properly. When the portion 14 overflows, the $\overline{Q}$ output of T9 is driven high which resets INT disabling the gate 30. Also, on overflow, Q of T9 goes low enabling the gates 44 and 46. Since $\overline{Q}$ of TS1 is low, the output of gate 44 goes high to set TS2 which disables the gate 38 and enables the gate 40. The resetting of INT also enables the gate 48 so that on the following $\phi_2$ pulse, the F/F's T1–T9 are reset, which disables the gates 44 and 46 and enables the gate 42 so that on the following $\phi_1$ strobe pulse, TS1 is reset. With TS1 reset, the gates 18 and 32 are enabled and the gate 20 is disabled.

The testing of the portion 12 of the counter 10 may be initiated by simulating another intrusion, i.e., setting the F/F INT which enables the gate 30 so that the clock pulses are fed to the first stage of the portion 12 through the gate 32. When T5 overflows, T9 is toggled and INT is reset to disable the gate 30, removing the pulsating output from the terminal 56. Also, toggling T9 enables the gates 44 and 46 and since the Q output of TS1 is low, TS2 is reset from the gate 46 thereby disabling the gate 40 and enabling the gate 38 and returning the circuitry to its normal condition.

In summary, initiation of the TEST 1 mode produces a pulsating output at the terminal 56 until the portion 14 of the counter 10 overflows whereupon the output at the terminal 56 is extinguished. This sequence of events indicates that the stages T5–T8 of the counter portion 14 are operating properly and that the portion 14 is properly interconnected with the overflow latch T9 as well as indicating that the oscillator and divider stages are properly operating. Upon simulation of a second intrusion, the pulsating output appears at the terminal 56 until the first five stages of the counter 10 overflow whereupon the output at terminal 56 is terminated. This sequence of events is indicative of the proper interconnection of the F/F's T1–T4 as well as proper interconnection of the portion 12 with the portion 14 through the complex gate 16.

With the above counter construction and control logic the 8-stage counter may be tested in approximately one minute as opposed to the approximate four minutes required when a conventional 8-stage counter is employed.

The embodiments of the invention in which an exclusive property or privilege is claimed are defined as follows:

1. A counter and circuitry for testing same, said counter partitioned into at least first and second portions, each portion containing a plurality of stages, first gate means adapted when enabled to apply a clock signal to the first stage of said first portion, steering gate means for selectively steering said clock signal or the output of the last stage of said first portion of said counter to the first stage of said second portion of said counter, control means responsive to a test input for controlling said first gate means and said steering gate means in a predetermined sequence to selectively apply said clock signal to the first stage of either said first portion or said second portion of said counter and for respectively detecting overflow of the first stage or last stage of said second portion of said counter.

2. A binary counter and circuitry for testing same, said counter partitioned into at least first and second portions, each containing a plurality of stages, first gate means adapted when enabled to apply a clock signal to the first stage of said first portion, steering gate means for selectively steering said clock signal or the output of the last stage of said first portion of said counter to the first stage of said second portion of said counter, overflow detection means for selectively detecting overflow of the first or last stage of said second portion of said counter, control means for controlling said first gate means, said steering gate means and said detection means, said control means having an initialized condition which enables said first gate means, steers the output of the last stage of said first portion to the first stage of said second portion and steers the output of said last stage of said second portion to said detection means, said control means responsive to a test input to disable said first gate means and enable said steering gate means to steer said clock signals to said first stage of said second portion, said control means responsive to overflow of the last stage of said second portion to enable said first gate means, enable said steering gate means to steer said output of the last stage of said first portion to the first stage of said second portion of said counter and enable said detection means to respond to overflow of the first stage of said second portion of said coounter, said control means adapted to return to said initialized condition in response to overflow of said first stage of said second portion of said counter.

3. A binary counter and circuitry for testing same, said counter partitioned into at least first and second portions, each containing a plurality of stages, first bistable switch means having a RESET state and a TEST 1 state, second bistable switch means having a RESET state and a TEST 2 state, third bistable switch means having a RESET state and an OVERFLOW state, first gate means for applying a clock signal to the input of said first portion when said first switch means is in said RESET state, second gate means for steering the output of said first portion to the input of said second portion when said first switch means is in said RESET state and for steering said clock signal to the input of said second portion when said first switch means is in said TEST 1 state, third gate means for steering the output of the last stage of said second portion to said third switch means when said second switch means is in said RESET state and for steering the output of the first stage of said second portion to said third switch means when said second switch means is in said TEST 2 state, whereby said third switch means may be selectively placed in said OVERFLOW state by the output of either said first or last stage of said second portion of said counter, said first switch means switching to said TEST 1 state in response to a TEST input, means for setting said second switch means to said TEST 2 state if said third switch means is in said OVERFLOW state and said first switch means is in said TEST 1 state, means for resetting said first and third switch means and said counter following the setting of said second switch means to said TEST 2 state, means for resetting said second switch means in response to said third switch means being placed in said OVERFLOW state while said first switch means is in said RESET state.

* * * * *